US009804205B2

(12) United States Patent
Duvjnak et al.

(10) Patent No.: US 9,804,205 B2
(45) Date of Patent: Oct. 31, 2017

(54) CURRENT SENSE RATIO COMPENSATION

(71) Applicant: Power Integrations, Inc., San Jose, CA (US)

(72) Inventors: Rajko Duvjnak, Kanata (CA); William M. Polivka, Campbell, CA (US)

(73) Assignee: Power Integrations, Inc., San Jose, CA (US)

( * ) Notice: Subject to any disclaimer, the term of this patent is extended or adjusted under 35 U.S.C. 154(b) by 235 days.

(21) Appl. No.: 14/697,365

(22) Filed: Apr. 27, 2015

(65) Prior Publication Data

US 2016/0313378 A1   Oct. 27, 2016

(51) Int. Cl.
*G01R 19/10*     (2006.01)
*G01R 19/00*     (2006.01)
*G01R 35/00*     (2006.01)
*G01R 31/26*     (2014.01)

(52) U.S. Cl.
CPC ......... *G01R 19/10* (2013.01); *G01R 19/0084* (2013.01); *G01R 19/0092* (2013.01); *G01R 31/2637* (2013.01); *G01R 35/005* (2013.01)

(58) Field of Classification Search
CPC ................................. G01R 19/10; G06G 7/184
See application file for complete search history.

(56) References Cited

U.S. PATENT DOCUMENTS

| | | | | |
|---|---|---|---|---|
| 5,994,941 A | * | 11/1999 | Akimoto | H03F 1/302 327/307 |
| 6,154,087 A | * | 11/2000 | Ito | G01D 3/0365 327/362 |
| 6,407,611 B1 | * | 6/2002 | Larsen | H01L 22/20 257/E21.525 |
| 7,365,559 B2 | | 4/2008 | Colbeck | |
| 8,456,226 B2 | * | 6/2013 | Au | H03F 3/45475 327/362 |
| 8,901,965 B2 | * | 12/2014 | Fish | G06F 9/3869 326/112 |

\* cited by examiner

*Primary Examiner* — Hai L Nguyen
(74) *Attorney, Agent, or Firm* — Christensen O'Connor Johnson Kindness PLLC

(57) ABSTRACT

A method for sensing the current in a high-electron-mobility transistor (HEMT) that compensates for changes in a drain-to-source resistance of the HEMT. The method includes receiving a sense voltage representative of the current in the HEMT, receiving a compensation signal representative of a drain-to-source voltage of the HEMT, and outputting as a compensated sense voltage a linear combination of the sense voltage and the compensation signal.

9 Claims, 5 Drawing Sheets

CURRENT SENSE RATIO COMPENSATION

BACKGROUND

1. Field of Disclosure

This application relates generally to current sense transistors and, more specifically, to techniques to compensate for variations in the current sense ratio between a current sensing transistor and a main transistor.

2. Description of the Related Art

Current sense transistors have been used for many years in integrated circuit applications where accurate current sensing can provide information for both control and overcurrent protection. Sense transistors are typically constructed from a small part or section of a larger transistor that carries the main current of the device. For example, in a conventional metal oxide semiconductor field effect transistor (MOSFET) device, the sense transistor may comprise a small section of the channel region of the main power transistor. In operation, the sense transistor may sample a small fraction of the channel current of the power transistor, thereby providing an indication of the current in the main transistor. The sense transistor and main transistor device typically share a common drain and gate, but each has a separate source electrode.

Sense transistors are useful in many power delivery applications to provide current limit protection and accurate power delivery. In providing these functions, the sense transistor generally maintains a constant current sensing ratio (CSR) with respect to a main power transistor over a wide range of drain currents (100 mA to 10 amperes), temperatures (−25° C. to 125° C.), as well as fabrication process variations and mechanical stress/packaging variations. The ratio of drain current of the main power transistor to that of the sense transistor typically ranges between 20:1 to 800:1, or greater.

High electron mobility transistors (HEMTs) are attractive devices for achieving high performance in high power applications as they have high electron mobility and a wide band gap, and are capable of being processed with conventional equipment and methods not substantially different from those already developed for silicon and present generations of compound semiconductors. A particularly desirable material for building a HEMT is the wide-bandgap compound semiconductor known as gallium nitride (GaN). The GaN-based transistor is capable of maximizing electron mobility by forming a quantum well at the heterojunction interface between e.g., an aluminum gallium nitride (AlGaN) barrier layer and a GaN layer. GaN-based transistors have received much attention for high power applications since they have on-resistances that are typically one or more orders of magnitude less than those of silicon (Si)-based or gallium arsenide (GaAs)-based transistors and hence, are operable at higher temperatures with higher currents and can withstand high voltage applications.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Among the challenges that arise in the design of a sense transistor for use in a power integrated circuit (IC) with a GaN-based power transistor is the variation of the drain to source resistance of the power transistor with respect to its drain to source voltage. As a result, for a fixed drain current of the power transistor, the current sampled by the sense transistor varies as the drain to source voltage of the power transistor varies. This causes the current sense ratio to deviate from the desired constant value.

Figure 1A:
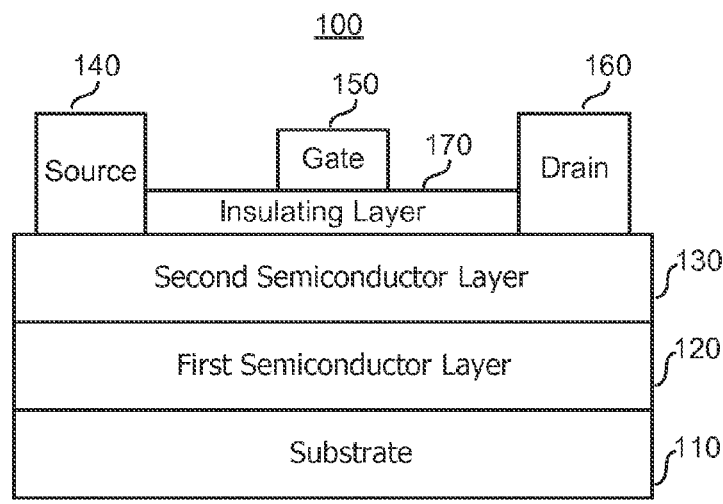
FIG. 1A is a schematic representation of cross-sectional view of a lateral-channel HEMT.

FIG. 1A is a schematic representation of cross-sectional view of an example lateral-channel HEMT 100. HEMT 100 includes a substrate layer 110, a first semiconductor layer 120, and a second semiconductor layer 130. First semiconductor layer 120 and second semiconductor layer 130 contact one another to form a heterojunction. Due to the material properties of semiconductor layers 120 and 130, a two dimensional electron gas arises at the heterojunction. HEMT 100 also includes a source electrode 140, a drain electrode 160, and a gate electrode 150. The selective biasing of gate electrode 150 regulates the conductivity between source electrode 140 and drain electrode 160.

In the illustrated implementation, source electrode 140 and drain electrode 160 both rest directly on an upper surface of second semiconductor layer 130 to make electrical contact therewith. This is not necessarily the case. For example, in some implementations, source electrode 140 and/or drain electrode 160 penetrate into second semiconductor layer 130. In some implementations, this penetration is deep enough that source electrode 140 and/or drain electrode 160 contact or even pass through the heterojunction. As another example, in some implementations, one or more interstitial glue, metal, or other conductive materials are disposed between source electrode 140 and/or drain electrode 160 and one or both of semiconductor layers 120, 130.

In the illustrated implementation, gate electrode 150 is electrically insulated from second semiconductor layer 130 by a single electrically-insulating layer 170 having a uniform thickness. This is not necessarily the case. For example, in other implementations, a multi-layer can be used to insulate gate electrode 150 from second semiconductor layer 130. As another example, a single or multi-layer having a non-uniform thickness can be used to insulate gate electrode 150 from second semiconductor layer 130.

The various features of lateral-channel HEMT 100 can be made from a variety of different materials, including Group III compound semiconductors. For example, first semiconductor layer 120 can be one of gallium nitride (GaN), indium nitride (InN), aluminum nitride (AlN), aluminum gallium nitride, (AlGaN), indium gallium nitride (InGaN), and indium gallium aluminum nitride (InGaAlN). In some implementations, first semiconductor layer 120 can also include compound semiconductors containing arsenic such as one or more of, e.g., gallium arsenide (GaAs), indium arsenide (InAs), aluminum arsenide (AlAs), indium gallium arsenide (InGaAs), aluminum gallium arsenide (AlGaAs), and indium aluminum gallium arsenide (InAlGaAs). Second semiconductor layer 130 can be, e.g., AlGaN, GaN, InN, InGaN, or AlInGaN. Second semiconductor layer 130 can also include compound semiconductors containing arsenic such as one or more of GaAs, InAs, AlAs, InGaAs, AlGaAs, or InAlGaAs. The compositions of first and second semiconductor layers 120, 130—which also can be referred to as active layers—are tailored such that a two-dimensional electron gas forms at the heterojunction. For example, in some implementations, the compositions of first and second semiconductor layers 120, 130 can be tailored such that a sheet carrier density of between $10^{11}$ to $10^{14}$ cm$^{-2}$ arises at the heterojunction. In some implementations, a sheet carrier density of between $5\times10^{12}$ to $5\times10^{13}$ cm$^{-2}$ or between $8\times10^{12}$ to $1.2\times10^{13}$ cm$^{-2}$ arises at the heterojunction. First and second semiconductor layers 120, 130 can be formed above substrate layer 110 which can be, e.g., GaN, GaAs, silicon carbide (SiC), sapphire ($Al_2O_3$), or silicon. First semiconductor layer 120 can be in direct contact with such a substrate layer, or one or more intervening layers can be present.

Source electrode 140, drain electrode 160, and gate electrode 150 can be made from various electrical conductors including, e.g., metals such as aluminum (Al), nickel (Ni), titanium (Ti), titanium tungsten (TiW), titanium nitride (TiN), titanium gold (TiAu), titanium aluminum molybdenum gold (TiAlMoAu), titanium aluminum nickel gold (TiAlNiAu), titanium aluminum platinum gold (TiAlPtAu), or the like. Insulating layer 170 can be made from various dielectrics suitable for forming a gate insulator including, e.g., ($Al_2O_3$), zirconium dioxide ($ZrO_2$), aluminum nitride (AlN), hafnium oxide ($HfO_2$), silicon dioxide ($SiO_2$), silicon nitride ($Si_3N_4$), aluminum silicon nitride (AlSiN), or other suitable gate dielectric materials. Insulating layer 170 can also be referred to as a passivation layer in that layer 170 hinders or prevents the formation and/or charging of surface states in the underlying second semiconductor layer 130.

Figure 1B:
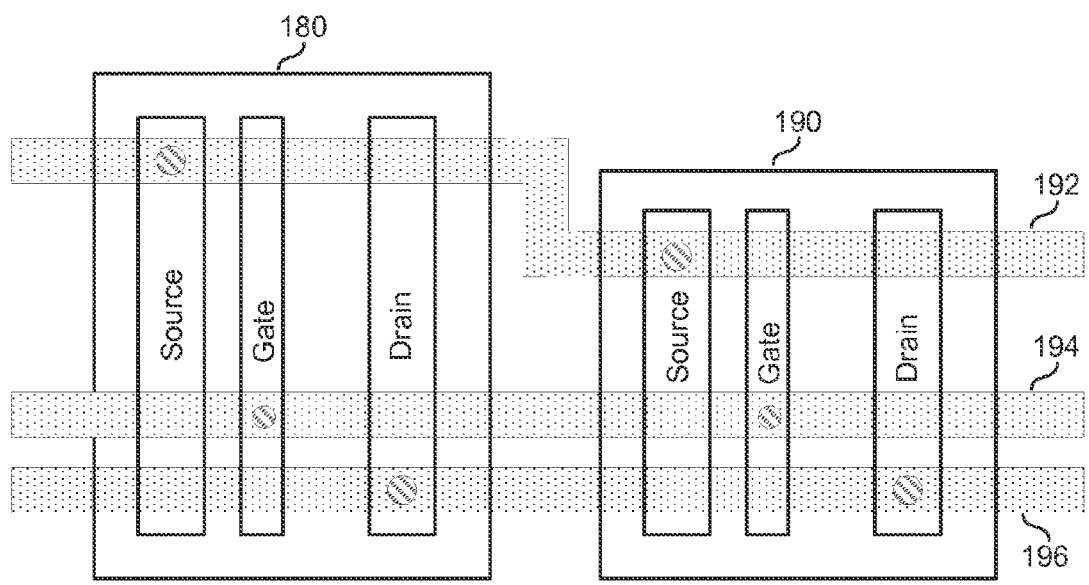
FIG. 1B is a schematic representation of top-view of a HEMT device including two HEMTs coupled together.

FIG. 1B is a schematic representation of a top-view of an example HEMT device including two HEMTs coupled together. As shown, source electrodes have metal pads that are coupled to a source metal bus 192 used to couple source electrodes of HEMTs 180 and 190 together. Similarly, gate electrodes have metals pads that are coupled to a gate metal bus 194 used to couple gate electrodes of HEMTs 180 and 190 together and drain electrodes have metal pads that are coupled to a drain metal bus 196 used to coupled drain electrodes of HEMTs 180 and 190 together. As such, in this configuration, the illustrated HEMT device includes two HEMTs coupled in parallel. In one example, one of HEMTs 180 and 190 can be used as a sense transistor to sense the drain current of the other, which may be referred to as a main transistor. In another example, the HEMT device can include more than one sense transistor coupled to the main transistor in parallel in the same manner as explained above. The main transistor and the one or more sense transistors may be formed on a single die. In some examples, there can be a resistor coupled between the metal pad of the source electrode of each one of the sense transistors and source metal bus 192. This resistor can be used to measure the current in the sense transistor(s). In the depicted example, for illustrative purposes only, the gate electrodes of HEMTs 180 and 190 are drawn to be smaller in one dimension than the source and drain electrodes. In other examples, gate electrodes can be approximately the same size as the source and/or drain electrodes.

Figure 2A:
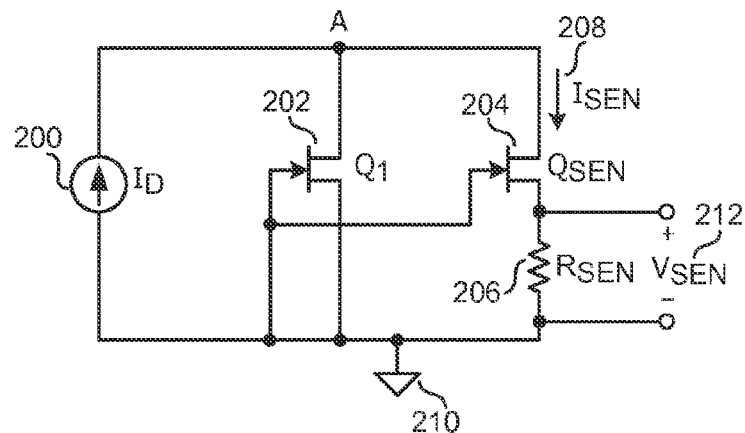
FIG. 2A is a circuit schematic of an example HEMT device that includes a main transistor and a sense transistor for sensing the drain current of the main transistor.

FIG. 2A is a circuit schematic that includes an example HEMT device having a main transistor and a sense transistor for sensing the drain current of the main transistor. As shown, a HEMT $Q_1$ 202, also referred to as main transistor 202, is coupled across a current source 200 between a node A and a ground reference 210. Ground reference 210 represents the lowest voltage or potential against which all voltages of the illustrated circuit are measured or referenced. HEMT $Q_1$ 202 has a drain terminal coupled to the node A, a source terminal coupled to ground reference 210, and a control terminal (gate) also coupled to ground reference 210. In the example of FIG. 2A, transistor 202 is a depletion mode transistor, being in a conducting state when the gate terminal is less than a threshold voltage above the source terminal. A depletion mode transistor is sometimes called a normally-on transistor. Therefore, transistor 202 is in a conducting state when the source terminal and the gate terminal are coupled to the same potential. In a typical application, the gate terminal may be coupled to a driver circuit that changes the voltage at the gate terminal to switch the transistor between a conducting state and a non-conducting state. In one example, HEMT $Q_1$ 202 is a Group III compound semiconductor FET such as, for example, a GaN FET. It should be noted that, with appropriate modification, other transistor types such as, for example, a metal oxide semiconductor FET (MOSFET) or a junction FET (JFET) can also be used as the main transistor.

The HEMT device includes a HEMT sense transistor $Q_{SEN}$ 204 for sensing the drain current of the main transistor. Sense transistor 204 shares drain and control terminals with those of main transistor 202. Source terminal of sense transistor 204 is coupled to ground reference 210 with a sense resistor $R_{SEN}$ 206. Sense transistor 204 is also a depletion mode transistor; hence, sense transistor 204 is in a conducting state when the voltage at its gate terminal is less than a threshold voltage above its source terminal.

Current source 200 is coupled to provide a current $I_D$ to the node A. The current $I_D$ is approximately equal to the drain current of main transistor 202. A relatively small fraction (e.g., one hundredth or less) of this current is drawn by sense transistor 204 as a sense current $I_{SEN}$ 208. Therefore, sense current $I_{SEN}$ 208 is representative of the drain current of main transistor 202. Since sense resistor $R_{SEN}$ 206 conducts the same current as sense transistor 204, the voltage that develops across sense resistor $R_{SEN}$ 206, which is referred to as a sense voltage $V_{SEN}$ 212, is representative of sense current $I_{SEN}$ 208. Hence, $V_{SEN}$ 212 sense voltage is also representative of the drain current of main transistor 202. In operation, sense voltage $V_{SEN}$ 212 is less than the threshold voltage of sense transistor 204 so that sense transistor 204 is in the conducting state when main transistor 202 is conducting current.

Figure 2B:
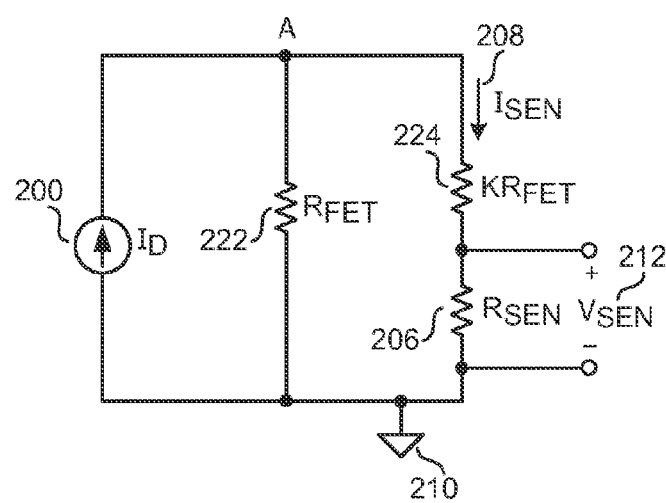
FIG. 2B is a circuit schematic that illustrates an equivalent representation of the HEMT device of FIG. 2A.

FIG. 2B is a schematic of an equivalent circuit of the circuit of FIG. 2A with HEMTs $Q_1$ 202 and $Q_{SEN}$ 204 in the ON state. When conducting current, main transistor 202 presents a certain amount of resistance between its drain and source terminals (i.e., drain to source resistance). As such, main transistor 202 can be modeled as a resistor $R_{FET}$ 222 coupled between the node A and ground reference 210. In this case, resistor $R_{FET}$ 222 is representative of the drain to source resistance of main transistor 202. Similarly, sense transistor 204 can be modeled as a resistor 224 coupled between sense resistor $R_{SEN}$ 206 and the node A. Resistor 224 represents the drain to source resistance presented by sense transistor 204 when sense transistor 204 is in a saturated conductive state. Resistor 224 may have a resistance that is several times (e.g., 100 times) the resistance of resistor $R_{FET}$ 222 such that sense current $I_{SEN}$ 208 is a relatively small fraction of the current through resistor 222.

It can be shown that sense voltage $V_{SEN}$ 212 is given by:

$$V_{SEN} = \frac{I_D R_{SEN}}{(1+K) + \frac{R_{SEN}}{R_{FET}}} \quad (1)$$

where K represents the ratio of the resistance of resistor 224 to the resistance of resistor $R_{FET}$ 222. As can be seen from equation (1), sense voltage $V_{SEN}$ 212 (and hence, sense current $I_{SEN}$ 208) is dependent on the drain to source resistance of main transistor 202 (resistance of resistor $R_{FET}$ 222). Therefore, the ratio of the drain current of main transistor 202 to sense current $I_{SEN}$ 208 is also dependent on the drain to source resistance of main transistor 202. Assuming that sense current $I_{SEN}$ 208 is several orders of magnitude (e.g., at least 100 times) lower than the drain current of main transistor 202 ($I_{SEN} \ll I_D$), the drain to source resistance of main transistor 202 can be approximated as:

$$R_{FET} = \frac{V_{DS}}{I_D} \quad (2)$$

where $V_{DS}$ corresponds to the voltage between the drain and the source terminals (i.e., the drain to source voltage) of main transistor 202. Substituting this expression for resistor $R_{FET}$ 222 in equation (1), an alternative expression for sense voltage $V_{SEN}$ 212 can be obtained as follows:

$$V_{SEN} = \frac{1}{\frac{(1+K)}{I_D R_{SEN}} + \frac{1}{V_{DS}}} \quad (3)$$

This equation implies that sense current $I_{SEN}$ 208, which can be obtained by dividing sense voltage $V_{SEN}$ 212 by the resistance of sense resistor $R_{SEN}$ 206, deviates from $I_D/(1+K)$ due to the influence of the drain to source voltage of main transistor 202. In other words, the drain to source voltage of main transistor 202 causes sense current $I_{SEN}$ 208 to deviate from a fixed fraction of the drain current of main transistor 202. The amount that sense current $I_{SEN}$ 208 deviates from $I_D/(1+K)$ decreases with increasing drain to source voltage of main transistor 202. To compensate for this deviation, both sense voltage $V_{SEN}$ 212 and the drain to source voltage of main transistor 202 may need to be measured.

Figure 2C:
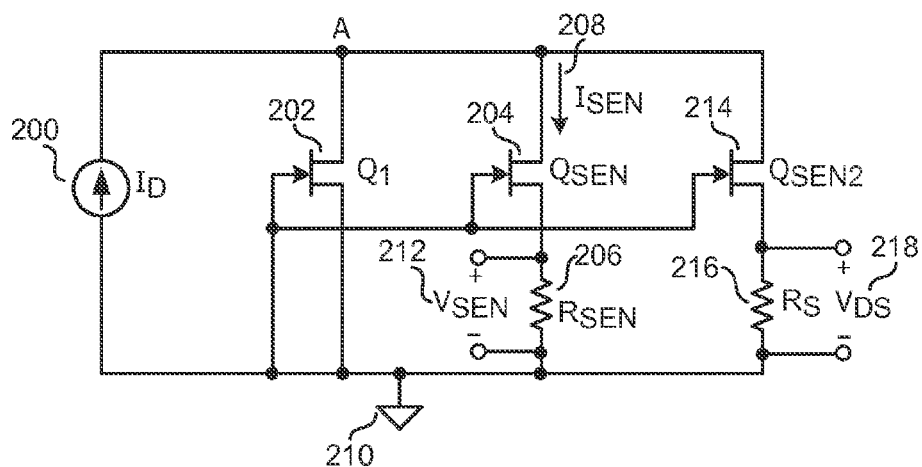
FIG. 2C is a circuit schematic of a HEMT device including a main transistor and two sense transistors.

FIG. 2C is a schematic of a circuit that includes an example HEMT device having a main transistor and two sense transistors. This circuit is similar to the circuit of FIG. 2A except that the HEMT device in FIG. 2C includes another HEMT as second sense transistor $Q_{SEN2}$ 214 for measuring the drain to source voltage of main transistor 202. In one example, main transistor $Q_1$ 202, sense transistor $Q_{SEN}$ 204, and second sense transistor $Q_{SEN2}$ 214 are Group III compound semiconductor HEMTs. Second sense transistor 214 shares drain and control terminals with those of main transistor 202. As further shown, source terminal of second sense transistor 214 is coupled to ground reference 210 with a resistor $R_S$ 216. If the resistance of resistor $R_S$ 216 (e.g., $10^4$ ohms) is several orders of magnitude greater than the drain to source resistance of second sense transistor 214 (e.g., between 10 and 100 ohms) when second sense transistor 214 is in a saturated conductive state, then the voltage that develops across resistor $R_S$ 216 is approximately equal to the drain to source voltage of main transistor 202. The drain to source voltage of main transistor 202 may also be referred to as a voltage $V_{DS}$. Therefore, in this case, the voltage across resistor $R_S$ 216 can be used to measure the voltage $V_{DS}$.

Figure 3:
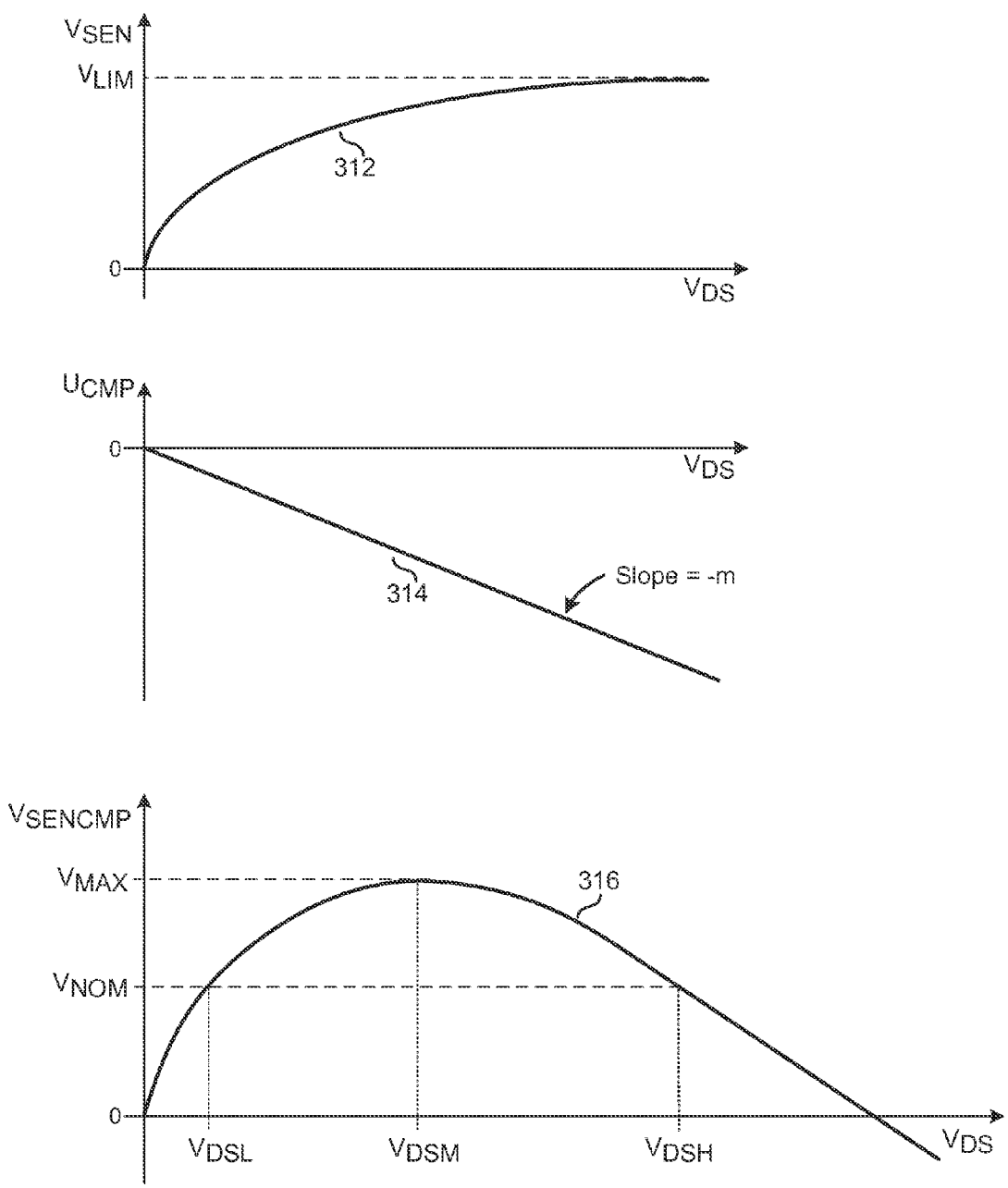
FIG. 3 shows example waveforms that correspond to a sense voltage representative of the drain current of the main transistor of the HEMT devices of FIG. 2A-2C, a compensation signal, and a compensated sense voltage.

FIG. 3 shows example curves that represent a sense voltage representative of the drain current of the main transistor of the HEMT devices of FIG. 2A-2C, a compensation signal, and a compensated sense voltage. Curve 312 is one possible representation of sense voltage $V_{SEN}$ 212 as a function of the voltage $V_{DS}$. Curve 312 starts at zero when the voltage $V_{DS}$ is zero volts and approaches $V_{LIM}$ (where $V_{LIM}$ corresponds to $(I_D R_{SEN})/(1+K)$) as the voltage $V_{DS}$ increases. Curve 314 is one possible representation of a compensation signal $U_{CMP}$ as a voltage that is a function of the voltage $V_{DS}$. Compensation signal $U_{CMP}$ can be used to reduce the influence of the voltage $V_{DS}$ on sense voltage $V_{SEN}$ 212, and hence, reduce the influence of the drain to source resistance of main transistor 202 on sense current $I_{SEN}$ 208. In one example, curve 314 is a linear ramp with a slope of $-m$ (i.e., a linear ramp with a negative slope). Curve 316 is one possible representation of a compensated sense voltage $V_{SENCMP}$ that can be obtained by adding curve 314 to curve 312.

After adding the compensation signal $U_{CMP}$ to sense voltage $V_{SEN}$ 212 given by equation (1) and manipulating the resulting expression such that the compensated sense voltage $V_{SENCMP}$ has the same value for a lower limit $V_{DSL}$ and a higher limit $V_{DSH}$, the following expression for the compensated sense voltage $V_{SENCMP}$ can be obtained:

$$V_{SENCMP} = \frac{V_{LIM} V_{NOM}}{V_{DSL} V_{DSH}} \left( \frac{\left(\frac{V_{DSL}}{V_{LIM}} + 1\right)\left(\frac{V_{DSH}}{V_{LIM}} + 1\right)}{\frac{1}{V_{LIM}} + \frac{1}{V_{DS}}} - V_{DS} \right) \quad (4)$$

where the lower limit $V_{DSL}$ and the higher limit $V_{DSH}$ represent the lower and the higher limits, respectively, of a range of values of the voltage $V_{DS}$ over which the influence of the voltage $V_{DS}$ on sense voltage $V_{SEN}$ 212 is aimed to be reduced. In equation (4), a nominal voltage $V_{NOM}$ represents a value of the compensated sense voltage $V_{SENCMP}$ that results in a desired ratio (e.g., $1/(1+K)$) between a compensated sense current (which can be found by dividing the compensated sense voltage $V_{SENCMP}$ by the resistance of sense resistor $R_{SEN}$ 206) and the drain current of main transistor 202 for the lower limit $V_{DSL}$ and the higher limit $V_{DSH}$. In one example, nominal voltage $V_{NOM}$ is equal to $V_{LIM}$ which is $I_D R_{SEN}/(1+K)$. As further illustrated by curve 316, the compensated voltage $V_{SENCMP}$ reaches a maximum value $V_{MAX}$ when the voltage $V_{DS}$ equals $V_{DSM}$ between the lower limit $V_{DSL}$ and the higher limit $V_{DSH}$. The maximum value $V_{MAX}$ can be expressed as follows:

$$V_{MAX} = \frac{V_{NOM} V_{LIM}^2 \left(\frac{V_{DSL}}{V_{LIM}}+1\right)\left(\frac{V_{DSH}}{V_{LIM}}+1\right)}{V_{DSL} V_{DSH}} \left(1 - \sqrt{\frac{1}{\left(\frac{V_{DSL}}{V_{LIM}}+1\right)\left(\frac{V_{DSH}}{V_{LIM}}+1\right)}}\right)^2 \quad (5)$$

In the illustrated example, the compensated sense voltage $V_{SENCMP}$ may vary less with respect to the voltage $V_{DS}$ when the voltage $V_{DS}$ is between the lower limit $V_{DSL}$ and higher limit $V_{DSH}$. This means that the resulting compensated sense current may deviate less from $I_D/(1+K)$ when the drain to source resistance of main transistor 202 is between a low value of $R_{DSL}$ (i.e., $V_{DSL}/I_D$) and a high value of $R_{DSH}$ (i.e., $V_{DSH}/I_D$). In this manner, the influence of the drain to source resistance of main transistor 202 on sense current $I_{SEN}$ 208 can be reduced such that the ratio of the drain current of main transistor 202 to sense current $I_{SEN}$ 208 deviates less from the desired value of $(1+K)$.

Figure 4A:
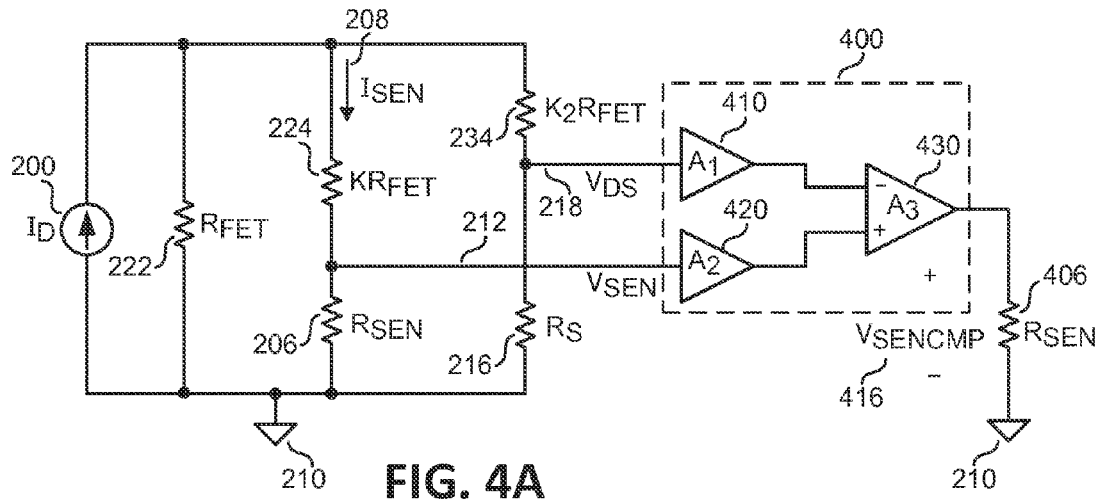
FIG. 4A is a circuit schematic illustrating one example implementation of a compensation circuit that outputs a compensated sense voltage.

FIG. 4A is a circuit schematic illustrating one example implementation of a compensation circuit that outputs the compensated sense voltage. Compensation circuit 400 includes amplifying stages 410, 420 and a differential amplifier 430. Amplifying stage 410 is coupled to receive the voltage across resistor $R_S$ 216 as the voltage $V_{DS}$ and outputs an amplified version of the voltage $V_{DS}$ to a negative input terminal of differential amplifier 430. Amplifier 420 is coupled to receive the voltage across sense resistor $R_{SEN}$ 206 as sense voltage $V_{SEN}$ 212 and outputs an amplified version of sense voltage $V_{SEN}$ 212 to a positive input terminal of differential amplifier 430. Amplifying stages 410 and 420 have respective gains of $A_1$ and $A_2$. Differential amplifier 430 has a gain of $A_3$ and is coupled to output an amplified version of the difference between the signal at its positive input terminal and the signal at its negative input terminal. In other words, differential amplifier 430 outputs a signal that is equal to $A_3$ times $(A_2 V_{SEN} - A_1 V_{DS})$.

It can be shown that if the values of $A_1$, $A_2$, and $A_3$ are chosen as follows:

$$A_1 = 1$$
$$A_2 = \left(\frac{(1+K)R_{DSL}}{R_{SEN}}+1\right)\left(\frac{(1+K)R_{DSH}}{R_{SEN}}+1\right)$$
$$A_3 = \frac{R_{SEN}^2}{(1+K)^2 R_{DSL} R_{DSH}},$$

then the signal at the output of differential amplifier 430 corresponds to compensated sense voltage $V_{SENCMP}$ given by equation (4). As previously explained, this signal will be equal to $I_D R_{SEN}/(1+K)$ when the drain to source resistance of main transistor 202 is equal to the low value of $R_{DSL}$ or the high value of $R_{DSH}$. Accordingly, if this signal is applied to sense resistor $R_{SEN}$ 406 such as, for example, by coupling sense resistor $R_{SEN}$ 406 between the output of differential amplifier 430 and ground reference 210, the resulting current in sense resistor $R_{SEN}$ 406 (which has the same value as resistor $R_{SEN}$ 206) becomes representative of the compensated sense current and equal to $I_D/(1+K)$ when the drain to source resistance of main transistor 202 is equal to the low value of $R_{DSL}$ or the high value of $R_{DSH}$. In addition, when the drain to source resistance of main transistor 202 varies between the low value of $R_{DSL}$ and the high value of $R_{DSH}$, the deviation of the compensated sense current from $I_D/(1+K)$ is less than the deviation of sense current $I_{SEN}$ 208 from $I_D/(1+K)$. Consequently, when the drain to source resistance of main transistor 202 varies between the low value of $R_{DSL}$ and the high value of $R_{DSH}$, the ratio of the drain current of main transistor 202 to the compensated sense current varies less than the ratio of the drain current of main transistor 202 to sense current $I_{SEN}$ 208. In this manner, change in the ratio of the drain current of main transistor 202 to sense current $I_{SEN}$ 208 due to the variation in the drain to source resistance of main transistor 202 can be compensated for over a range of values of the drain to source resistance of main transistor 202.

Figure 4B:
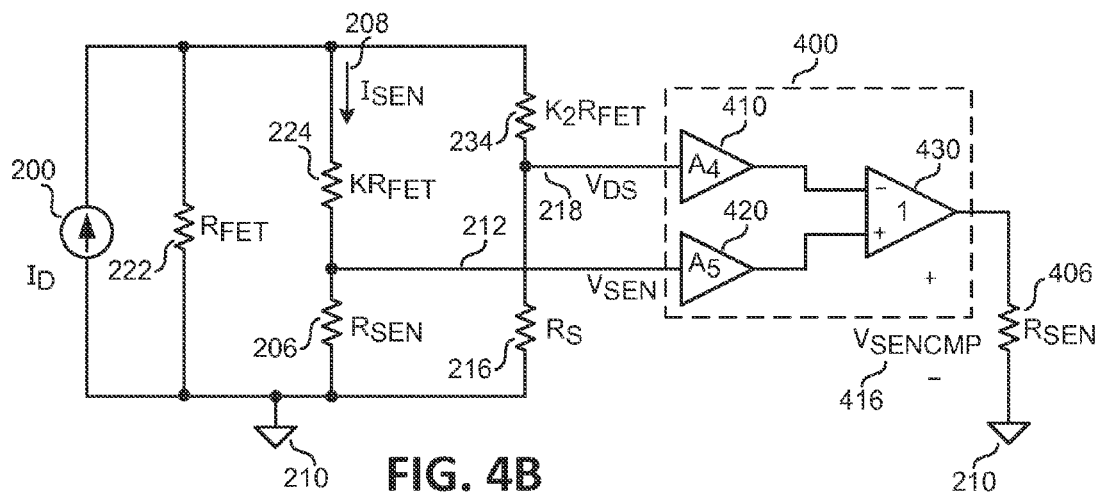
FIG. 4B is a circuit schematic illustrating another example implementation of a compensation circuit that outputs a compensated sense voltage.

FIG. 4B is a circuit schematic illustrating another example implementation of the compensation circuit that outputs the compensated sense voltage. Compensation circuit 400 in FIG. 4B is equivalent to compensation circuit 400 in FIG. 4A but implemented with different gain values $A_4$, $A_5$, and $A_6$ for amplifying stages 410, 420 and differential amplifier 430. With the following choices for values of $A_4$, $A_5$ and $A_6$:

$$A_4 = \frac{R_{SEN}^2}{(1+K)^2 R_{DSL} R_{DSH}}$$
$$A_5 = \frac{\left(R_{DSL} + \frac{R_{SEN}}{(1+K)}\right)\left(R_{DSH} + \frac{R_{SEN}}{(1+K)}\right)}{R_{DSL} R_{DSH}}$$
$$A_6 = 1$$

the resulting compensated sense voltage $V_{SENCMP}$ 416 and compensated sense current are the same as those that are described for FIG. 4A.

Figure 4C:
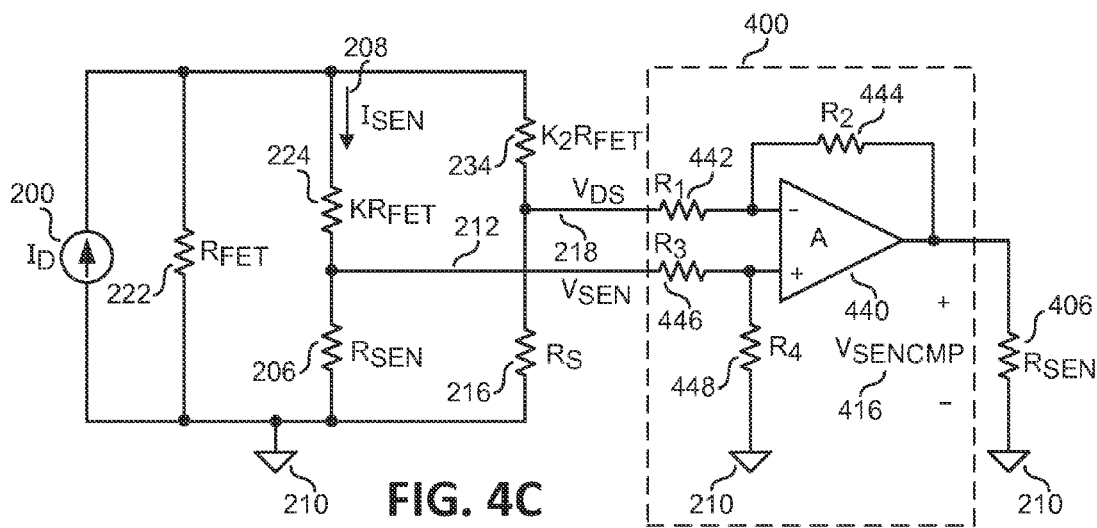
FIG. 4C is a circuit schematic illustrating yet another example implementation of a compensation circuit that outputs a compensated sense voltage.

FIG. 4C is a circuit schematic illustrating yet another example implementation of the compensation circuit that outputs the compensated sense voltage. Compensation circuit 400 in FIG. 4C includes a differential amplifier 440 having a gain of A and resistors $R_1$ 442, $R_2$ 444, $R_3$ 446, and $R_4$ 448. Differential amplifier 440 has a negative input terminal coupled to resistor $R_1$ 442 and a positive input terminal coupled to resistor $R_3$ 446. Resistor $R_1$ 442 and resistor $R_3$ 446 are on the other end coupled to receive the voltage across resistor $R_S$ 216 and sense voltage $V_{SEN}$ 212, respectively. Resistor $R_2$ 444 is coupled between the negative input terminal and the output of differential amplifier 440 and resistor $R_4$ 448 is coupled between the positive input terminal of differential amplifier 440 and ground reference 210. The output of differential amplifier 440 is coupled to sense resistor 406, which has the same value as resistor $R_{SEN}$ 206. In the illustrated example, resistors $R_1$ 442, $R_2$ 444, $R_3$ 446, and $R_4$ 448 and gain value A can be chosen such that the resulting compensated sense voltage $V_{SENCMP}$ 416 and compensated sense current are the same as those that are described for one of FIG. 4A and FIG. 4B. In the example circuit of FIG. 4C, differential amplifier 440 may be an operational amplifier with a gain value A high enough to be negligible in the computation of values for the values of resistors as is known in the art. In other words, with resistors $R_1$ 442, $R_2$ 444, $R_3$ 446, and $R_4$ 448 and gain value A chosen appropriately, compensation circuit 400 in FIG. 4C can be made equivalent to compensation circuit 400 in one of FIG. 4A and FIG. 4B.

Figure 5:
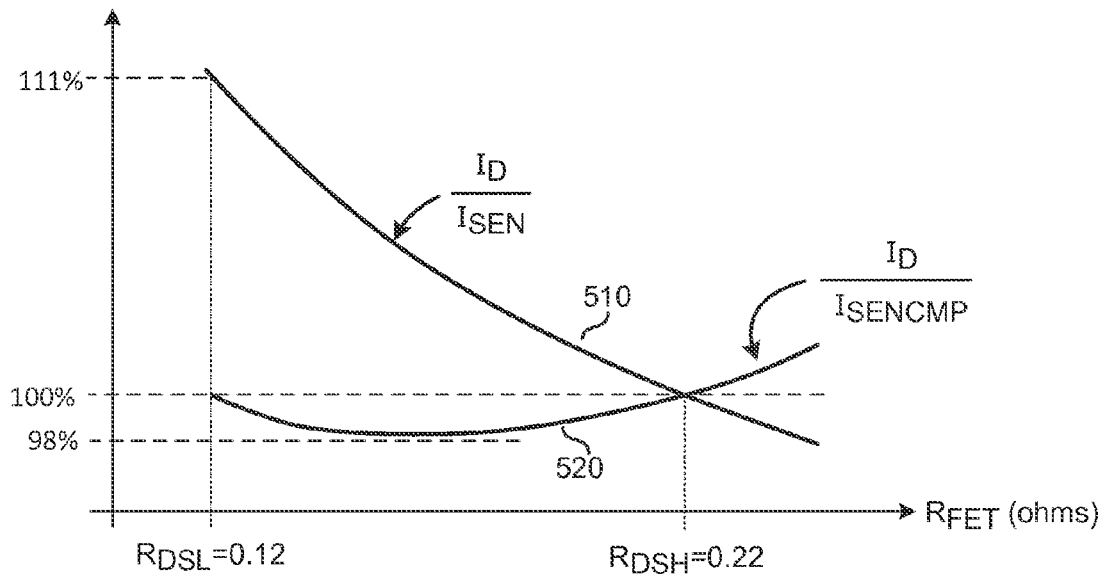
FIG. 5 shows example normalized curves that correspond to a ratio of the drain current of the main transistor of the HEMT device in FIG. 2C to a sense current and a ratio of the drain current of the main transistor of the HEMT device in FIG. 2C to a compensated sense current.

FIG. 5 shows example curves that correspond to a ratio of the drain current of the main transistor of the HEMT device in FIG. 2C to a sense current and a ratio of the drain current of the main transistor of the HEMT device in FIG. 2C to a compensated sense current. The values are normalized to a desired nominal value to show the relative deviations from the desired nominal value. Curve 510 is one possible representation of the ratio of the drain current of main transistor 202 to sense current $I_{SEN}$ 208 as a function of the drain to source resistance of main transistor 202. Curve 520 is one possible representation of the ratio of the drain current of main transistor 202 to the compensated sense current as a function of the drain to source resistance of main transistor 202. The compensated sense current may be obtained by using compensation circuit 400 in one of FIG. 4A, FIG. 4B, and FIG. 4C. In the illustrated example, the low value $R_{DSL}$ and the high value $R_{DSH}$ of the drain to source resistance of main transistor 202 are chosen as 0.12 ohms and 0.22 ohms, respectively. In addition, the value of K, which represents the ratio of the resistance of resistor 224 to the resistance of resistor $R_{FET}$ 222, is adjusted differently for curves 510 and 520 such that curve 510 and curve 520 have the same value for the high value $R_{DSH}$ of the drain to source resistance of main transistor 202. In this case, this value of curves 510 and 520 may represent the desired ratio of the drain current of main transistor 202 to sense current $I_{SEN}$ 208. Also, curves 510 and 520 are normalized with respect to this value such that the numbers on the y-axis represent the corresponding ratios in terms of percentage of this value.

As further shown, under these conditions, curve 510 increases as the drain to source resistance of main transistor 202 decreases from the high value $R_{DSH}$ of 0.22 ohms and becomes approximately equal to 110% (e.g., 111%) of the desired ratio when the drain to source resistance of main transistor 202 is equal to the low value $R_{DSL}$ of 0.12 ohms. In other words, curve 510 deviates up to 11% from the desired ratio as the drain to source resistance of main transistor 202 varies between the low value $R_{DSL}$ of 0.12 ohms and the high value $R_{DSH}$ of 0.22 ohms. On the other hand, curve 520 has the same desired ratio when the drain to source resistance of main transistor 202 is equal to the low value $R_{DSL}$ of 0.12 ohms and deviates less than 2% from the desired ratio as the drain to source resistance of main transistor 202 varies between the low value $R_{DSL}$ of 0.12 ohms and the high value $R_{DSH}$ of 0.22 ohms. Therefore, compensation circuit 400 in one of FIG. 4A, FIG. 4B and FIG. 4C can be used to generate the compensated sense current such that the variation in the ratio of the drain current of main transistor 202 to sense current $I_{SEN}$ 208 is reduced with respect to the variation in the drain to source resistance of main transistor 202.

Figure 6:
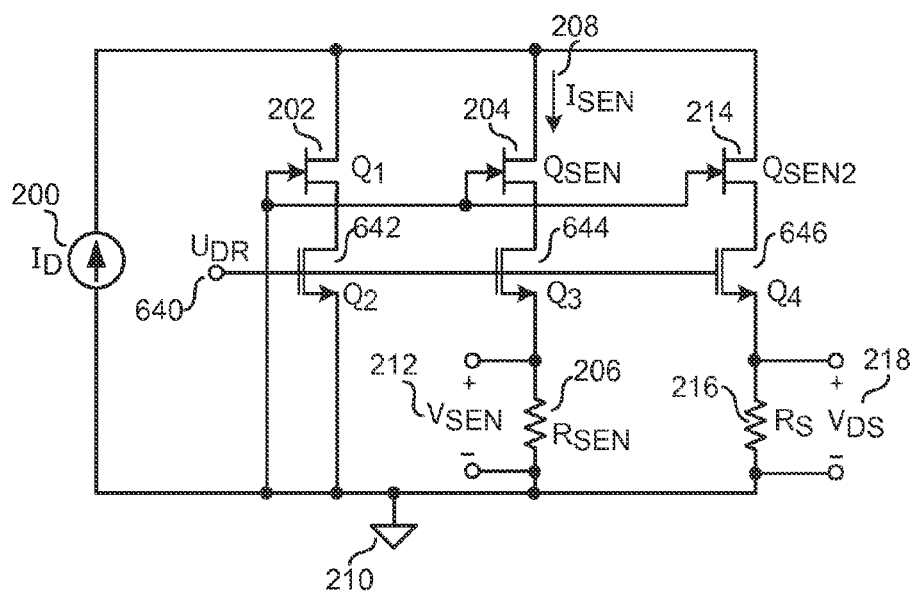
FIG. 6 is a circuit schematic of another example HEMT device including a main transistor and two sense transistors.

FIG. 6 is a schematic of another circuit that includes an example HEMT device having a main transistor and two sense transistors. The HEMT device in FIG. 6 is similar to the HEMT device in FIG. 2C except that each one of main transistor 202 and sense transistors 204 and 214 are coupled to a corresponding MOSFET to form a cascode configuration. Specifically, the source terminal of main transistor 202 is coupled to the drain terminal of MOSFET $Q_2$ 642, the source terminal of sense transistor 204 is coupled to the drain terminal of MOSFET $Q_3$ 644, and the source terminal of second sense transistor 214 is coupled to the drain terminal of MOSFET $Q_4$ 646. In one example, main transistor 202 in FIG. 6 may be a normally-on HEMT (e.g., a GaN based normally-on HEMT). Typically, a normally-on HEMT can be coupled to a normally-off (enhancement mode) MOSFET in a cascode configuration to ensure reliable and easy switching. In the illustrated example, normally-off MOSFETs $Q_2$ 642, $Q_3$ 644, and $Q_4$ 646 are coupled to receive a drive signal $U_{DR}$ 640 at their respective control (gate) terminals. As such, drive signal $U_{DR}$ 640 controls the switching of MOSFETs $Q_2$ 642, $Q_3$ 644, and $Q_4$ 646.

Similar to main transistor 202 in FIG. 2C, main transistor 202 in FIG. 6 can use compensation circuit 400 in one of FIG. 4A, FIG. 4B, and FIG. 4C to generate a compensated current sense signal to reduce the variation in the ratio of the drain current of main transistor 202 to sense current $I_{SEN}$ 208 with respect to the variation in the drain to source resistance of main transistor 202 over a range of values of the drain to source resistance of main transistor 202. It should be noted that in the case of main transistor 202 in FIG. 6, the drain to source resistances of main transistor 202, sense transistor 204, and second sense transistor 214 also include the drain to source resistances of the corresponding MOSFETs.

What is claimed is:

1. A device comprising:
   a power high-electron-mobility transistor (HEMT) comprising:
   a first main terminal;
   a second main terminal; and
   a first gate disposed to regulate conductivity between the first main terminal and the second main terminal of the power HEMT;
   a current sense HEMT comprising:
   a third main terminal coupled to the first main terminal of the power HEMT;
   a fourth main terminal; and
   a second gate disposed to regulate conductivity between third main terminal and the fourth main terminal of the current sense HEMT, wherein the second gate is coupled to the first gate of the power HEMT;
   a voltage sense HEMT comprising:
   a fifth main terminal coupled to the first main terminal of the power HEMT;
   a sixth main terminal; and
   a third gate disposed to regulate conductivity between fifth main terminal and the sixth main terminal, wherein the third gate is coupled to the first gate of the power HEMT;
   a current sense resistance coupled between the second main terminal of the power HEMT and the fourth main terminal of the current sense HEMT;
   a voltage sense resistance coupled between the second main terminal of the power HEMT and the sixth main terminal of the voltage sense HEMT;
   a first normally-off transistor coupled in a cascode arrangement with the power HEMT;
   a second normally-off transistor coupled in a cascode arrangement with the current sense HEMT; and
   a third normally-off transistor coupled in a cascode arrangement with the voltage sense HEMT.

2. The device of claim 1, wherein:
   the current sense resistance has a resistance that is less than a resistance between the third main terminal and the fourth main terminal when the current sense HEMT is in a saturated conductive state; and
   the voltage sense resistance has a resistance that is greater than a resistance between the fifth main terminal and the sixth main terminal when the voltage sense HEMT is in a saturated conductive state.

3. The device of claim 2, wherein:

the current sense resistance has a resistance that is less than 0.1 times the resistance between the third main terminal and the fourth main terminal when the current sense HEMT is in a saturated conductive state; and the voltage sense resistance has a resistance that is greater than 10 times the resistance between the fifth main terminal and the sixth main terminal when the voltage sense HEMT is in a saturated conductive state.

4. The device of claim 1, wherein the power HEMT, the current sense HEMT, and the voltage sense HEMT are formed on a single die.

5. The device of claim 1, wherein the power HEMT, the current sense HEMT, and the voltage sense HEMT are Group III compound semiconductor HEMTs.

6. The device of claim 1, wherein the power HEMT in a saturated conductive state conducts a current that is greater than ten times a current conducted by the current sense HEMT in a saturated conductive state.

7. The device of claim 1, further comprising a compensation circuit coupled to receive:

from the current sense HEMT, a current sense signal representative of the current through the power HEMT; and from the voltage sense HEMT, a voltage sense signal representative of the voltage across the power HEMT.

8. The device of claim 7, wherein the compensation circuit is coupled to output a compensated sense current signal representative of a difference between a scaled version of the current sense signal and a scaled version of the voltage sense signal.

9. The device of claim 7, wherein the compensation circuit comprises one or more amplifiers coupled to output a compensated sense current signal of:

$$A_i(A_{ii}V_{SEN} - A_{iii}V_{DS}),$$

wherein:

$A_{ii}$, $A_{ii}$, and $A_{iii}$ are scaling values, at least two of which are related to a resistance between the first main terminal of the power HEMT and the second main terminal of the power HEMT when the power HEMT is in a saturated conductive state;

$V_{SEN}$ is the current sense signal; and $V_{DS}$ is the voltage sense signal.

* * * * *